(12) United States Patent
Stupp et al.

(10) Patent No.: US 6,680,215 B2
(45) Date of Patent: Jan. 20, 2004

(54) LIQUID CRYSTAL-TEMPLATED CONDUCTING ORGANIC POLYMERS

(75) Inventors: Samuel I. Stupp, Chicago, IL (US); James F. Hulvat, Chicago, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 10/272,707

(22) Filed: Oct. 17, 2002

(65) Prior Publication Data
US 2003/0087533 A1 May 8, 2003

Related U.S. Application Data
(60) Provisional application No. 60/330,387, filed on Oct. 18, 2001.

(51) Int. Cl.[7] .................................... H01L 21/00
(52) U.S. Cl. ...................... 438/30; 438/99; 257/40; 205/78
(58) Field of Search ................ 438/30, 149, 99, 438/292, 793, 794; 257/40; 205/78

(56) References Cited

U.S. PATENT DOCUMENTS

| | | | | |
|---|---|---|---|---|
| 5,849,215 A | * | 12/1998 | Gin et al. | 252/299.01 |
| 6,060,333 A | * | 5/2000 | Tanaka et al. | 438/30 |
| 6,225,239 B1 | * | 5/2001 | Ohno et al. | 438/780 |
| 6,326,215 B1 | * | 12/2001 | Keen | 438/1 |
| 6,380,007 B1 | * | 4/2002 | Koyama | 438/151 |
| 6,503,382 B1 | * | 1/2003 | Bartlett et al. | 205/67 |
| 6,524,877 B1 | * | 2/2003 | Nakazawa et al. | 438/48 |

* cited by examiner

Primary Examiner—Kevin M. Picardat
(74) Attorney, Agent, or Firm—Reinhart Boerner Van Deuren s.c.

(57) ABSTRACT

A method of preparing a conductive polymeric film, includes providing a liquid crystal phase comprising a plurality of hydrophobic cores, the phase on a substrate, introducing a hydrophobic component to the phase, the component a conductive polymer precursor, and applying an electric potential across the liquid crystal phase, the potential sufficient to polymerize the said precursor.

24 Claims, 9 Drawing Sheets

LIQUID CRYSTAL-TEMPLATED CONDUCTING ORGANIC POLYMERS

This application claims priority benefit from provisional application Ser. No. 60/330,387 filed Oct. 18, 2001, the entirety of which is incorporated herein by reference.

The United States Government has certain rights to this invention pursuant to Grant No. DE-FG02-00ER45810/A001 from the Department of Energy to Northwestern University.

BACKGROUND OF THE INVENTION

Since the discovery of conducting polymers in 1977, Shirakawa, H.; Lewis, E. J.; MacDiarmid, A. G.; Chiang, C. K.; Heeger, A. J. 1977, 578, extensive research has focused on developing these materials for organic electronic devices. Organic semiconductors such as poly(phenylene vinylene), poly(thiophene), poly(acetylene) and poly(pyrrole) have found application in devices ranging from organic light-emitting diodes (OLEDs) to field effect transistors (FETs). Katz, H. E.; Bao, Z. *Journal of Physical Chemistry B* 2000, 104, 671–678; Greiner, A. *Polymers For Advanced Technologies* 1998, 9, 371–389; Gurunathan, K.; Vadivel Murugan, A.; Marimuthu, R.; Mulik, U. P.; Amalanerkar, D. P. *Journal of Materials Chemistry and Physics* 1999, 61, 173–191. Organic electronics do not match the performance of inorganic, silicon-based devices, due to fundamental limitations on charge carrier mobility in conducting polymers. Katz, H. E.; Bao, Z. *Journal of Physical Chemistry B* 2000, 104, 671–678. The oft stated advantages of organic electronics, i.e., low cost, mechanical flexibility and ease of processing, could open entire new areas of technical development such as large area displays and disposable electronics—areas not currently accessible with silicon based devices. However, the most promising organic electronics to date are fabricated using vapor sublimated single crystal films of organic molecules patterned using conventional, silicon-based technology. Katz, H. E.; Bao, Z. *Journal of Physical Chemistry B* 2000, 104, 671–678; Cui, J.; Huang, Q. L.; Wang, Q. W.; Marks, T. J. *Langmuir* 2000, 17, 2051–2054. Achieving the goals of low cost and ease of processing requires the development of room temperature, aqueous, solution-based processes for fabricating thin films of conducting polymers.

Both chemical and electrochemical approaches to form thin films of conducting polymers have been developed. Bradley, D. D. C.; Grell, M.; Grice, A.; Tajbakhsh, A. R.; O'Brien, D. F.; Bleyer, A. *Optical Materials* 1998, 9, 1–11. Sato, M. A.; Sakamoto, M. A.; Miwa, M.; Hiroi, M. *Polymer* 2000, 41, 5681–5687. Pei, Q. B.; Zuccarello, G.; Ahlskog, M.; Inganas, O. *Polymer* 1994, 35, 1347–1351. Dietrich, M.; Heinze, J.; Heywang, G.; Jonas, F. *Journal of Electroanalytical Chemistry* 1994, 369, 87–92. A variety of monomers can be electropolymerized in polar organic solvents, and these films have been used to make both OLEDs and organic FETs. Tasch, S.; Gao, J.; Wenzl, F. P.; Holzer, L.; Leising, G.; Heeger, A. J.; Scherf, U.; Mullen, K. *Electrochemical and Solid State Letters* 1999, 2, 303–305; Johansson, T.; Mammo, W.; Andersson, M. R.; Inganas, O. *Chemistry of Materials* 1999, 11, 3133–3139; Pei, J.; Yu, W. L.; Huang, W.; Heeger, A. J. *Macromolecules* 2000, 33, 2462–2471; Sainova, D.; Miteva, T.; Nothofer, H. G.; Scherf, U.; Glowacki, I.; Ulanski, J.; Fujikawa, H.; Neher, D. *Applied Physics Letters* 2000, 76, 1810–1812; Osaka, T.; Komaba, S.; Fujihana, K.; Okamoto, N.; Momma, T.; Kaneko, N. *Journal of the Electrochemical Society* 1997, 144, 742–748. The main limitation is that polymeric films are typically amorphous and contain a large number of defects. One way to reduce defects is through use of substituted monomers such as 3,4-ethyldioxythiophene (EDOT) or by polymerizing short oligomers such as bithiophene. Kabasakaloglu, M.; Kiyak, T.; Toprak, H.; Aksu, M. L. *Applied Surface Science* 1999, 152, 115–125.

Even without defects, the amorphous nature of electropolymerized films limits performance in organic devices. In an amorphous conducting polymer film, inter-chain charge hopping leads to non-radiative quenching of electron-hole pairs (excitons). Nanoscale control of the arrangement and orientation of organic molecules can improve the luminescence efficiency of OLEDs and increase the speed of organic FETs. Poly(thiophene) is a hole conductor (p-type) and is electroluminescent, meaning it can be used as either the hole transport or emissive layer of an OLED. Charge injection from an electrode into the hole-transporting layer is improved by orienting polymer chains normal to the electrode surface (parallel to the applied field), compared with a randomly oriented amorphous film. Markart, P.; Zojer, E.; Tasch, S.; Smith, R.; Gin, D.; Leising, G. *Synthetic Metals* 1999, 102, 1155–1156. Isolating molecules reduces exciton quenching and improves the efficiency of OLEDs. Osterbacka, R.; An, C. P.; Jiang, X. M.; Vardeny, Z. V. *Science* 2000, 287, 839–842. For organic FETs, aligning polymer chains is critical for improving device performance, enhancing both carrier mobility and conductivity. Bao, Z. N.; Rogers, J. A.; Katz, H. E. *Journal of Materials Chemistry* 1999, 9, 1895–1904; Bjornholm, T.; Hassenkam, T.; Greve, D. R.; McCullough, R. D.; Jayaraman, M.; Savoy, S. M.; Jones, C. E.; McDevitt, J. T. *Advanced Materials* 1999, 11, 1218–1221. This is one reason why single crystal films are often used. Chain alignment within a non-crystalline film enhances carrier mobility while remaining simpler to process.

Poor solubility of conducting polymers is the primary obstacle to using most conventional methods for aligning polymer chains. Thiophene, phenylene vinylene, and other precursors to conjugated polymers are soluble in many organic solvents, especially polar solvents like acetonitrile and tetrahydrofuran (THF). However, the conducting polymers they form are generally insoluble due to their tendency to π-π stack, causing long oligomers or polymers to aggregate in solution. Chemical or electrochemical polymerization of thiophene leads to an intractable, insoluble material that is difficult to characterize or process. Addition of long alkyl chains or other solubizing groups to the 3 or 4 position on the thiophene ring improves solubility. Sato, M. A.; Sakamoto, M. A.; Miwa, M.; Hiroi, M. *Polymer* 2000, 41, 5681–5687; Kilbinger, A. F. M.; Feast, W. J. *Journal of Materials Chemistry* 2000, 10, 1777–1784; Tour, J. M.; Wu, R. L. *Macromolecules* 1992, 25, 1901–1907. Certain substituents even lead to water-soluble monomers and polymers. Stephan, O.; Schottland, P.; Le Gall, P. Y.; Chevrot, C.; Mariet, C.; Carrier, M. *Journal of Electroanalytical Chemistry* 1998, 443, 217–226. However, large substituents sterically constrain the monomer, inhibiting electropolymerization and degrading electronic properties of the material. Without large solubilizing groups, orientation and alignment of organic semiconductors after polymerization is extremely difficult.

An alternate approach involves the use of a template to position the monomers and lock-in the orientation for alignment during polymerization. Liquid crystals (LCs) are an example of a self-organizing system. One type of lyotropic LC is formed by amphiphilic molecules containing hydrophobic and hydrophilic segments that segregate in a solvent.

At low concentrations, amphiphilic molecules form spherical micelles in solution. At higher concentrations, several LC mesophases are possible, including hexagonal, cubic and lamellar structures. The particular mesophase formed depends on a balance between the attractive and repulsive forces on the hydrophilic head group and hydrophobic tail, and the relative volumes of these head/tail segments. Israelachvili, J. *Intermolecular & Surface Forces;* 2 ed.; Academic Press: San Diego, Calif., 1992; Kunieda, H.; Umizu, G.; Yamaguchi, Y. *Journal of Colloid and Interface Science* 1999, 218, 88–96.

OBJECTS OF THE INVENTION

In light of the foregoing, it is an object of the present invention to provide general methodologies relating to the use of liquid crystals to template the electropolymerization of precursors for conducting or light-emissive compositions. Various related objectives of this invention can be illustrated by comparison with the prior art.

For instance, P. Braun, et. al. used a liquid crystal to directly template hexagonal superlattices of cadmium sulfide. Braun, P. V.; Osenar, P.; Stupp, S. I. *Nature* 1996, 380, 325–328; Braun, P. V.; Osenar, P.; Tohver, V.; Kennedy, S. B.; Stupp, S. I. *Journal of the American Chemical Society* 1999, 121, 7302–7309. In this case water soluble cadmium precursors segregated to the hydrophilic regions of the hexagonal LC mesophase. Accordingly, it is an object of the present invention to utilize relatively non-polar, organic precursors, which should segregate to and be confined within the hydrophobic core of an LC mesophase. As a related object, electropolymerization of monomers within the hydrophobic cores should result in polymers aligned by the LC mesophase and electronically isolated within the hydrophobic cores.

D. Gin et. al. reported a method for a water-soluble, thermally convertible poly(phenylene vinylene) (PPV) based precursors confined within aqueous channels of an inverse hexagonal mesophase. Markart, P.; Zojer, E.; Tasch, S.; Smith, R.; Gin, D.; Leising, G. *Synthetic Metals* 1999, 102, 1155–1156; Gin, D.; Smith, R.; Deng, H.; Leising, G. *Synthetic Metals* 1999, 101, 52–55. However, the inverse hexagonal (H2) mesophase incorporated a photopolymerizable group. After UV exposure to cross-link the LC mesophase, the material is heated to form a substituted poly(phenylene vinylene) (PPV) in situ within the hydrophilic channels of the structure. While this approach of the prior art is limited to water soluble, thermally polymerizable precursors, an object of the present invention is to extend associated methodologies to a wider range of conducting polymers.

S. Tolbert, et. al clearly demonstrated the ability to control energy transfer and enhance electro-optical properties of semiconducting polymers by isolating them within nanoscale channels. Wu, J. J.; Gross, A. F.; Tolbert, S. H. *Journal of Physical Chemistry B* 1999, 103, 2374–2384; Nguyen, T. Q.; Wu, J. J.; Doan, V.; Schwartz, B. J.; Tolbert, S. H. *Science* 2000, 288, 652–656; Nguyen, T. Q.; Wu, J.; Tolbert, S. H.; Schwartz, B. J. *Advanced Materials* 2001, 13, 609–+. A surfactant, water and a silica precursor were used to template nanoporous silica with hexagonal symmetry. Substituted PPV molecules are inserted into the pores by soaking samples in an organic solution. Though quite useful, templating via mesoporous silica is limited to soluble polymers, since the material is not polymerized in situ. This process of the prior art also requires calcination at high temperature (500° C.) to form the silica template. As such, an object of this invention is to provide a templating methodology accomplished at or near room temperature and to extend the templating methodology to precursors that form insoluble polymers.

Bayer AG developed the first commercialized conducting polymer, using poly(styrene sulfonate) (PSS) as a polyelectrolyte to solubilize 3,4-ethyldioxythiophene (EDOT) monomer in water. Groenendaal, B. L.; Jonas, F.; Freitag, D.; Pielartzik, H.; Reynolds, J. R. *Advanced Materials* 2000, 12, 481–494. Polymerization results in a blend of poly(3,4-ethyldioxythiophene) (PEDOT) and PSS. While this method of the prior art solubilizes the otherwise insoluble PEDOT, it does not result in any ordering of the polymer. Films cast from the PEDOT-PSS solution are amorphous because the PSS forms a micellar solution. Accordingly, it is an object of the present invention to provide a templating strategy that will order, orient and/or advantageously align conducting polymers.

C. Henry, et. al., Henry, C.; Armand, F.; Araspin, O.; Bourgoin, J. P.; Wegner, G. *Chemistry of Materials* 1999, 11, 1024–1029, described electropolymerization of substituted thiophene precursors in an oriented alkylcellulose. However, domain size within the cellulose structure was on the order of microns, and thus could not result in confinement of individual molecules. In addition, such an alkylcellulose structure, though having a preferred orientation, is not ordered in multiple dimensions. Accordingly, other objects of the present invention include use of LCs ordered in multiple dimensions and/or on a nanoscale to better utilize the benefits available through a template strategy.

Other objects, features, benefits and advantages of the present invention will be apparent from the following summary and descriptions of various preferred embodiments, and will be readily apparent to those skilled in the art having knowledge of various templating, electropolymerization and/or device fabrication techniques. Such objects, features, benefits and advantages will be apparent from the above as taken into conjunction with the following examples, data, figures and all reasonable inferences to be drawn therefrom.

SUMMARY OF THE INVENTION

The present invention relates generally to a templating strategy utilizing nanoscale dielectric channels in liquid crystals to orient and isolate conducting, light-emissive polymers. Orientation and isolation of polymer chains enhances charge injection and reduce exciton quenching via interchain charge transfer. The inventive methodologies and related strategies involve confining monomeric precursors within the cylindrical hydrophobic core of a hexagonal lyotropic liquid crystal (LC). One preferred embodiment, illustrating various broader aspects of this invention, involves use of an amphiphilic oligo(ethylene oxide)-alkyl ether, which can form a self-supporting gel in water, or other suitable solvent/liquid systems, with a hexagonal (H1) mesophase of nanoscale cores. The hydrophobic nature of these cores allows high concentrations of precursor molecules, such as bithiophene or 3,4-ethyldioxythiophene (EDOT), to be solublized in an aqueous mesophase without disrupting the LC order.

Figure 1:
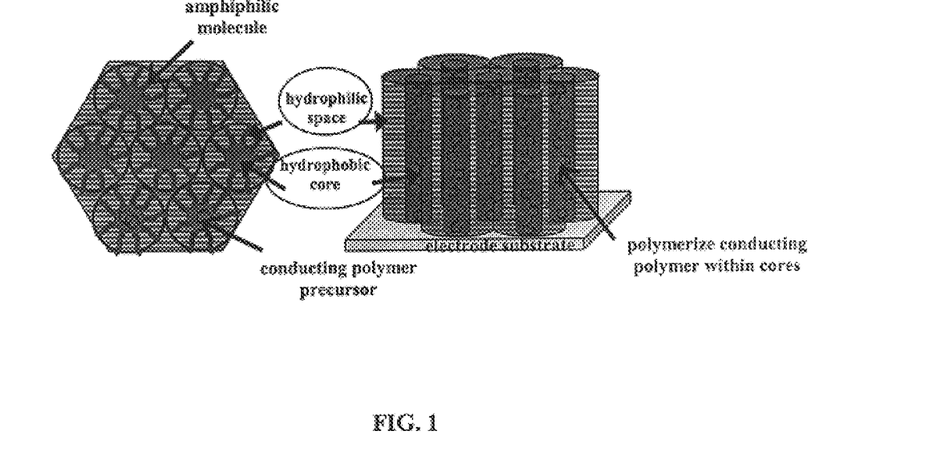
FIG. 1. General scheme for templating conducting polymers. Hydrophobic monomers are confined within the hydrophobic core of a lypotropic LC and then electropolymerized, resulting in polymers confined and aligned within the LC template.

Electropolymerization of EDOT within the LC gel forms the conducting polymer poly(ethyldioxythiophene) (PEDOT). The resulting PEDOT film precisely mimics the orientation and domain texture of the LC template. When the LC template is removed, the PEDOT remaining on the electrode exhibits a birefringent texture commensurate with the original liquid crystal gel. EDOT electropolymerizes preferentially, but not necessarily, in LC domains oriented parallel to the applied potential. This novel result indicates the optical anisotropy of the LC mesophase is templated on the growing polymer. The PEDOT film formed is electrochromic, electrochemically dopable, and can be reversibly oxidized and reduced. This facile approach bridges the gap between conventional lithography and molecular self-assembly by confining polymers within a nanoscale liquid crystal template ordered over hundreds of microns. Precursor monomers are isolated, oriented, polymerized and doped in a single step. FIG. 1 illustrates various features and aspects relating to the methods, systems and/or compositions of this invention.

Notwithstanding such representative embodiments, the present invention is directed more broadly to a method of preparing a conductive polymeric film. Such a method includes 1) providing an ordered mesophase of an amphiphilic liquid crystalline component; 2) introducing hydrophobic monomer to the mesophase; and 3) electropolymerizing the monomer. In preferred embodiments, with reference to FIG. 1, the liquid crystal provides a hexagonal mesophase comprising cylindrical hydrophobic cores of nanoscale dimension. Even so, as discussed more fully below, various other mesophases are possible and can be utilized within the context of this invention, depending upon liquid crystal identity and/or concentration in water, in polar organic solvents or, alternatively, in such mixed aqueous/organic solvents.

The methodologies of this invention are illustrated with reference to one or more preferred amphiphilic components. However, various other amphiphiles can be utilized with comparable effect, as would be known by those skilled in the art made aware of this invention. For instance, with respect to the oligo(ethylene oxide)oleyl ether component described herein, various other amphiphiles can be designed through choice of alkyl chain length, branching, degree of unsaturation and/or the extent to which such oxyalkylene units or other hydrophilic moieties are incorporated therein. Such components are commercially-available or can be prepared from the corresponding alcohols and alkylene oxides, or corresponding hydrophilic moiety precursors, using synthetic procedures well known to those skilled in the art.

More generally, the liquid crystal templates of this invention can be described with reference to the nanometric dimension of the resulting hydrophobic cores. Variations in the length and/or structural configuration of the hydrophobic portions of such amphiphiles can modify the core dimension. Alternatively, a co-surfactant or other additive can also be introduced to modify core dimension, alter the mesophase ordering or enhance stability of the liquid crystalline template. For instance, introduction of 1-decene swells core dimension and can be thereby used to enhance isolation of polymer precursors within the cores. In a similar fashion, a hydrophilic component such as ethylene glycol can be introduced to stabilize the corresponding portion of the resulting domains.

As mentioned above, the aqueous mesophase of such liquid crystal domains are used to solubize a variety of electropolymerizable monomers, the identity of which is limited only by dimensional considerations with respect to the liquid crystal template and the utility of the resulting electropolymer. Useful concentrations of such monomers must be below those which would otherwise disrupt the liquid crystalline mesophase. Within such guidelines, a variety of hydrophobic monomers can be incorporated into and aligned with the liquid crystal/template structures of this invention.

With reference to the preceding, the present invention also includes, in part, a method of using a liquid crystalline template to align conducting organic polymers. Such a method includes 1) providing an amphiphilic liquid crystal composition having an ordered mesophase in aqueous, polar organic or mixed solvents; 2) introducing a hydrophobic monomer to a hydrophobic portion of the liquid crystal mesophase; and 3) electropolymerizing the monomers to provide a polymer aligned with the hydrophobic portion of the mesophase.

As a result, the present invention is also directed to an optically anisotropic medium including an organic polymer film. The film comprises electropolymerized monomeric components, the polymers resulting therefrom aligned normal, perpendicular or otherwise angled with respect to a field applied to the monomers. The film is birefringent under polarized light.

More specifically, the present invention also includes a semi-conducting, organic polymeric film having a morphology exhibiting a birefringent texture under polarized light. Such a film is obtainable by 1) providing an amphiphilic liquid crystal having an ordered mesophase in aqueous, polar organic or mixed solvents; 2) introducing thereto a hydrophobic monomer; and 3) electropolymerizing the monomer. The texture of the resulting polymeric film substantially matches the birefringent texture of the liquid crystal mesophase structure.

EXAMPLES OF THE INVENTION

The following non-limiting examples and data illustrate various aspects and features relating to the methods and components of the present invention, including the preparation of ordered, aligned, anisotropic semi-conducting polymeric films. In comparison with the prior art, the present methods and compositions provide results and data which are surprising, unexpected and contrary thereto. While the utility of this invention is illustrated through the use of several liquid crystals/templates and monomeric components aligned therewith, it will be understood by those skilled in the art that comparable results are obtainable with various other liquid crystals/templates and monomeric components, as are commensurate with the scope of this invention.

Example 1

Figure 2:
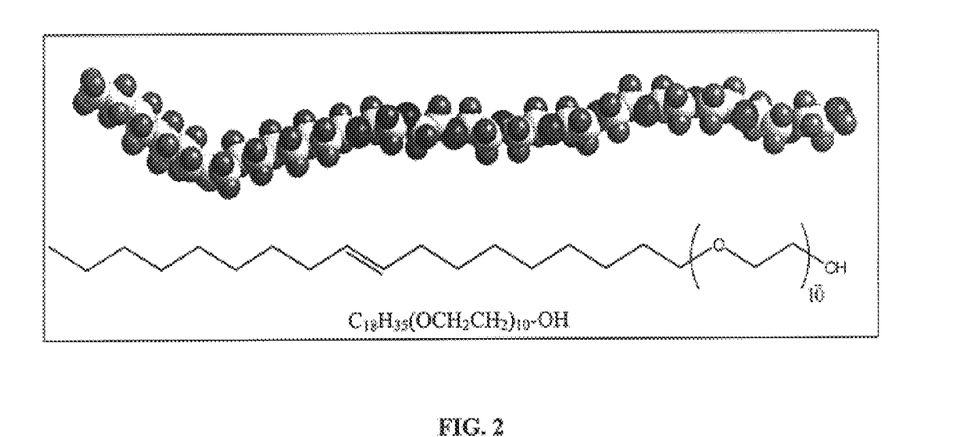
FIG. 2. Chemical structure of poly(oxyethylene)$_{10}$-oleyl ether, abbreviated (EO)$_{10}$-oleyl. Molecular graphics representation shows a possible extended conformation of amphiphile.

As mentioned above, an amphiphile developed for liquid crystal templating is the nonionic surfactant poly (oxyethylene)$_{10}$-oleyl ether (Aldrich), abbreviated (EO)$_{10}$-oleyl, shown in FIG. 2. Concentrations between 45–60 wt. % in water can form a self-supporting gel of a lyotropic liquid crystal with a hexagonal mesophase. This particular amphiphile, illustrative of other compositions useful with the present invention, was chosen due to its ease of use, commercial availability and low cost.

Figure 3:
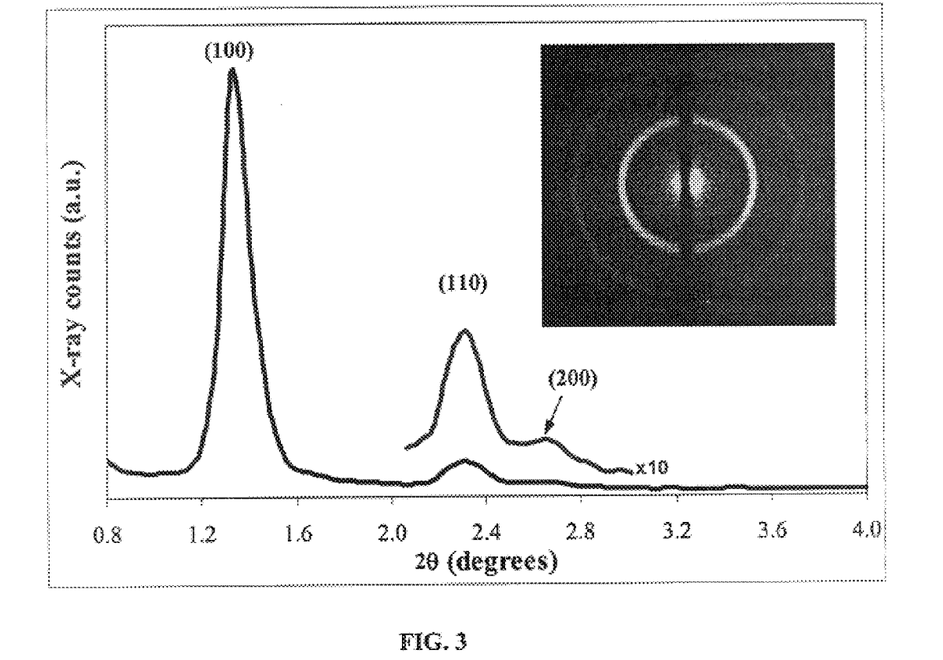
FIG. 3. Small angle XRD of (EO)$_{10}$-oleyl. Inset shows 2D diffraction pattern. The upper plot is a 10× magnification of the region from 2–3 deg. Peak spacings indicate the LC mesophase is hexagonal.

As with respect to the embodiment of this example, the desired target monomer concentration can be determined based on the structure of the (EO)$_{10}$-oleyl gel. For instance, a 2.0 g gel consisting of 50 wt. % amphiphile in water can be prepared by combining both components and heating to isotropization with vigorous mixing. This concentration corresponds to four H$_2$O molecules per (EO) unit on the amphiphile. This fully hydrates the ethylene oxide oligomer, as exactly four H$_2$O molecules can cluster around each (EO) unit. Kunieda, H.; Umizu, G.; Yamaguchi, Y. *Journal of Colloid and Interface Science* 1999, 218, 88–96. Solutions were held in sealed vials at 60° C. (above isotropization) to remove bubbles and then cooled to room temperature. The LC gel was placed in a small angle X-ray diffractometer with a Cu$_{K\alpha}$ source ($\lambda$=1.542 A, 32 kV, 13 mA) and a 2D detector in a transmission geometry. FIG. 3 shows the spectrum, collected for 1000 sec. The 2θ scale was calibrated using a silver behenate standard. The d-spacings of the three observed peaks are 6.65 nm, 3.85 nm and 3.38 nm. The peaks, indexed as (100), (110) and (200), have $d_{100}/d_{110}$ and $d_{100}/d_{200}$ ratios of 1.73 and 1.97, matching the expected 1: $\sqrt{3}$:2 ratio and confirming the hexagonal structure of the liquid crystal. The core-to-core spacing of the liquid crystal is thus 7.68 nm.

The density of the (EO)$_{10}$-oleyl gel at 20° C. is 1.01 g/cm$^3$. From this information, the gel contains 21 amphiphile molecules per nanometer along the cylindrical hydrophobic core. The extended length of thiophene oligomers, determined using molecular modeling software, is 0.34 nm per monomer. Thus, to optimally confine one extended polymer in each hydrophobic core, a monomer concentration in the gel of about 0.10 M is used.

Example 2

As mentioned above, EDOT (Bayer, 99%) is a representative electropolymerizable monomer. This precursor forms a conducting polymer and is relatively hydrophobic, with a water solubility of ~0.002M. The monomer is soluble in the (EO)$_{10}$-oleyl gel up to 0.2 M, beyond the target concentration, without disrupting the mesophase. A supporting electrolyte enhances the conductivity of organic solutions for electropolymerization and provides a negative counter ion to charge balance the cation radical attached to the growing polymer. Without restriction to any one theory or mode of operation, the supporting electrolyte provides a mobile charged species in solution, helping to maintain charge neutrality at the electrode surface. In addition, the supporting electrolyte can enable electrochemical doping of the semiconducting polymer. Supporting electrolytes reported in the literature for electropolymerization fall into three categories: lithium salts, tetralkylammonium salts, and sulfonated polyanions. Pei, Q. B.; Zuccarello, G.; Ahlskog, M.; Inganas, O. *Polymer* 1994, 35, 1347–1351; Dietrich, M.; Heinze, J.; Heywang, G.; Jonas, F. *Journal of Electroanalytical Chemistry* 1994, 369, 87–92; Stephan, O.; Schottland, P.; Le Gall, P. Y.; Chevrot, C.; Mariet, C.; Carrier, M. *Journal of Electroanalytical Chemistry* 1998, 443, 217–226; Sakmeche, N.; Bazzaoui, E. A.; Fall, M.; Aeiyach, S.; Jouini, M.; Lacroix, J. C.; Aaron, J. J.; Lacaze, P. C. *Synthetic Metals* 1997, 84, 191–192. The ideal supporting electrolyte would be soluble and dissociated in both hydrophobic and hydrophilic regions of the LC template. An electrolyte concentration 1–10 times that of the monomer is desirable. Several common electrolytes (LiClO$_4$, tetralkylammonium iodide, tetrabutylammonium perchlorate (TBAP), tetrabutylammonium hexafluorophosphate (TBAPF$_6$) were eliminated because their solubility in water and the (EO)$_{10}$-oleyl amphiphile was below 0.1 M. Of the remaining, (EO)$_{10}$-oleyl gels were prepared with tetraethylammonium perchlorate (TEAP), sodium dodecylsulfate (SDS) and sodium dodecylbenzylsulfonate (NaDBS), none of which disrupted the LC mesophase at concentrations of at least 0.2 M. The choice of supporting electrolyte is specific to each particular combination of template and electropolymerizable monomer. However, the above approach can provide general guidance on choosing a supporting electrolyte for a variety of other systems.

Example 3

Figure 4:
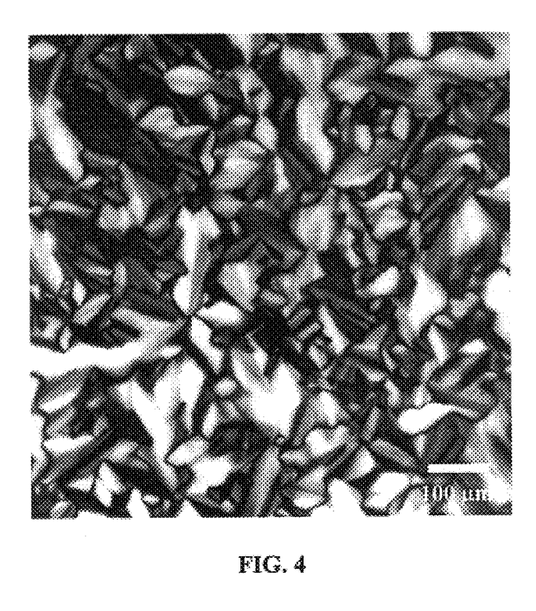
FIG. 4. Optical micrograph of (EO)$_{10}$-oleyl between crossed polarizers (cooled at 5° C./min.).

Qualitative examination of the effect of dopants on the LC structure is carried out using polarized optical microscopy (POM). A thin film of gel is squeezed between glass slides and heated under $N_2$ using a temperature-controlled stage. Once the sample is isotropic (appears dark under polarized light), the material is cooled at a rate of 1–5° C./min. When the LC structure forms, the material becomes strongly birefringent. A typical texture from these samples between crossed polarizers is shown in FIG. 4. The material is transparent when viewed with non-polarized light. Low concentrations (0.1M) of dopants have no effect on the birefringence pattern.

Example 4

Figure 5:
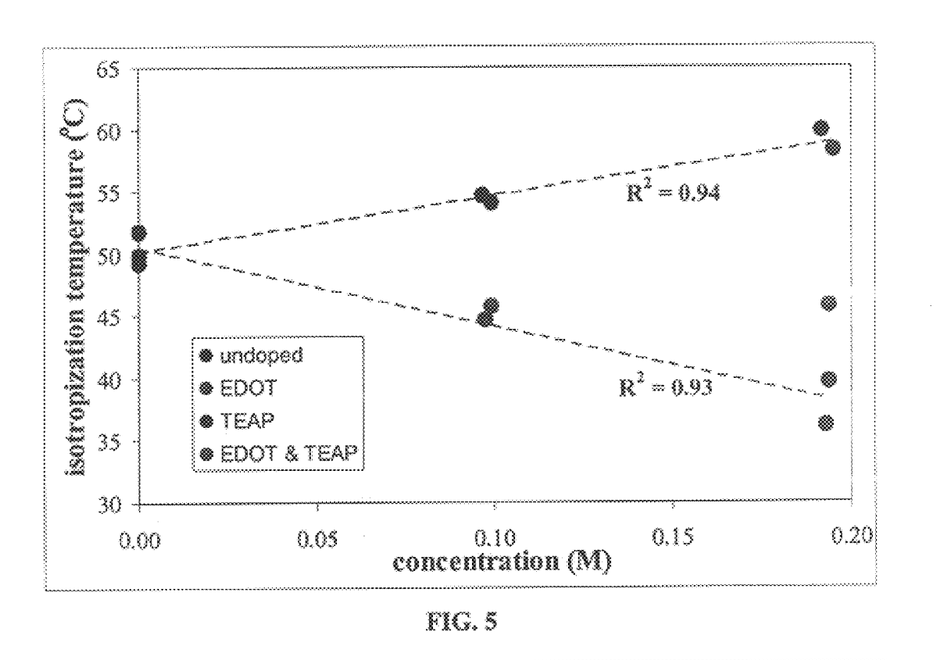
FIG. 5. Effect of EDOT monomer and TEAP supporting electrolyte on isotropization temperature of (EO)$_{10}$-oleyl LC as a function of concentration, as measured by DSC. Dashed lines show a linear best fit of the data.

The hexagonal-to-isotropic transition temperature (Ti) characterizes the stability of the LC mesophase. This is determined using differential scanning calorimetry (DSC). DSC was performed using two temperature cycles from 20 to 75° C. Samples were heated at a rate of 10° C./min. and cooled at 5° C./min. Isotropization temp ($T_i$) was determined from the second heating cycle. The addition of TEAP supporting electrolyte stabilizes the gel, raising $T_i$, while the addition of EDOT monomer destabilizes the gel, lowering $T_i$. The combined effects of both dopants partially cancel out. FIG. 5 illustrates this for different concentrations of EDOT and TEAP. The trend is nearly linear with concentration over the range of 0–0.2 M.

Example 5

Figure 6:
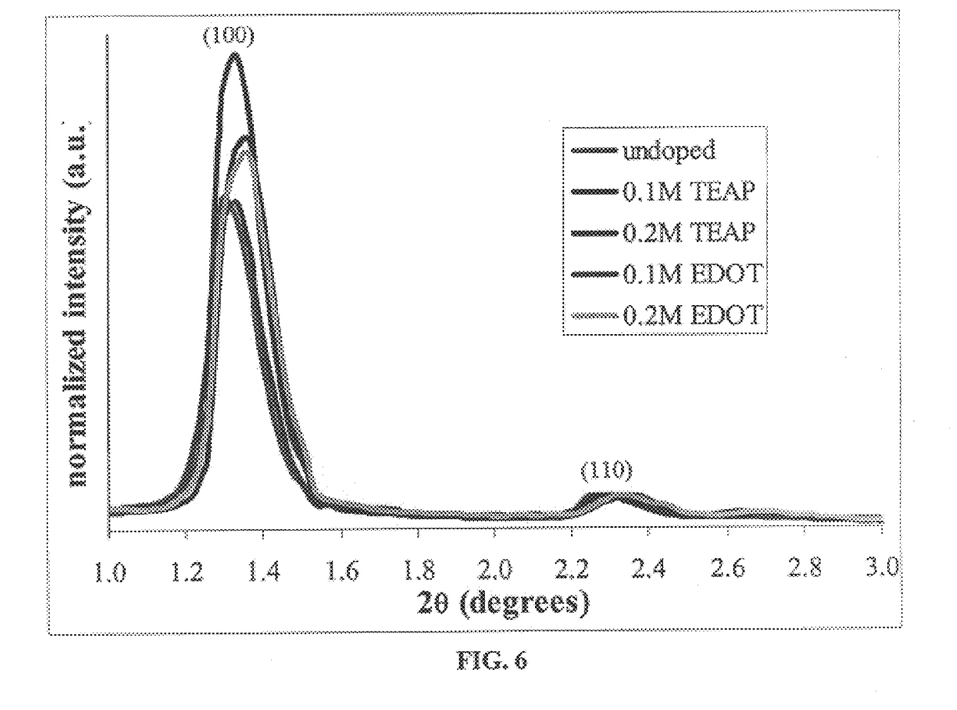
FIG. 6. Effect of EDOT monomer and TEAP supporting electrolyte on XRD of (EO)$_{10}$-oleyl gel. The dopants have no effect on d-spacing (up to 0.2M), but do increase intensity of (100) peak relative to (110) peak. Intensities are normalized to the (110) peak.

The location of dopants and their effect on the $(EO)_{10}$-oleyl gel mesophase is evaluated by small angle X-ray diffraction (XRD). The addition of 0.2 M TEAP or EDOT had no effect on the core-to-core spacing of the $(EO)_{10}$-oleyl LC mesophase. As shown in FIG. 6, all specimens had a $d_{100}$ spacing of 6.7 nm, indicating these concentrations of dopants are easily incorporated in the LC structure. The only effect observed is an increase in the (100) peak intensity relative to the (110) peak. This is due to a shift in the electron density within the structure, confirming that these dopants localize within the hydrophobic cores or at the hydrophilic/hydrophobic interface.

Example 6

Figure 7:
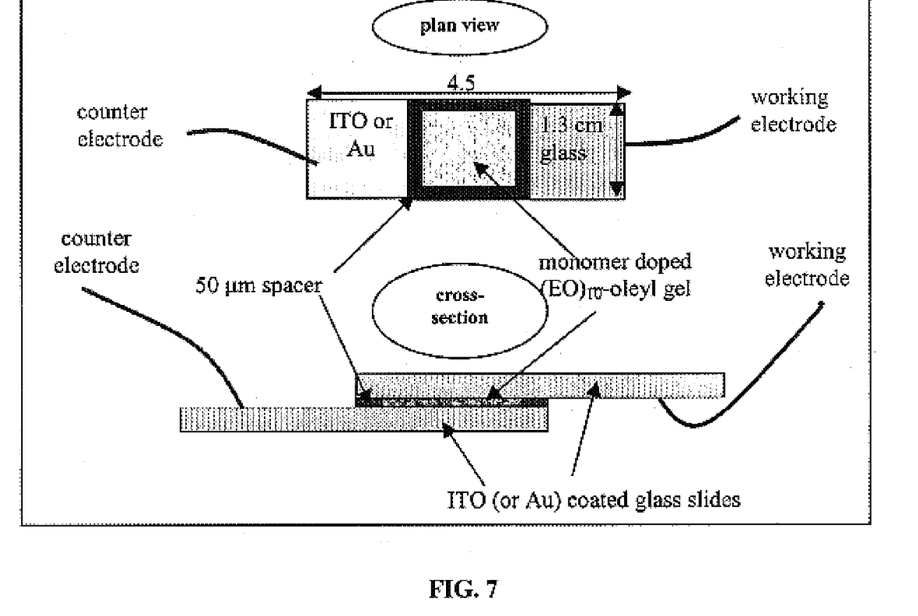
FIG. 7. Schematic representation of a two-electrode device used for electropolymerization of gel specimens. Voltage is applied across the 50 µm gap between ITO/glass plates. (not drawn to scale)

Electropolymerization of semiconducting polymers is normally accomplished by immersing a substrate in an acetonitrile solution of the monomer and supporting electrolyte, using a typical three-electrode cell configuration. Pei, Q. B.; Zuccarello, G.; Ahlskog, M.; Inganas, O. *Polymer* 1994, 35, 1347–1351. This is not possible in the LC templating system due to the highly viscous, gel-like state of the hexagonal mesophase. Instead, a two-electrode device structure as shown in FIG. 7 was designed. For transparent electrodes, ITO coated glass (120 nm, 20 Ω/□, Applied Thin Films Inc.) or e-beam evaporated Au/Ti films (50 nm/20 nm) on glass is used. For flexible devices, Au or ITO coated mylar could also be used. A thin (50 μm) adhesive film spacer seals the gel within the device and maintains a uniform spacing between the electrodes. Sealing the device allows heat treatment of the LC gel without permitting evaporation to alter the gel composition. Other electrode materials as well as various spacer thicknesses can be used depending on the desired application.

Example 7

Electropolymerization can be accomplished under potentiostatic (constant potential), or cyclic conditions. Electropolymerization was attempted using the sample configuration shown in FIG. 7 (example 6). Only two supporting electrolytes resulted in polymerization of the EDOT monomer, TEAP and SDS. $(EO)_{10}$-oleyl gel is stable under an applied potential up to 2.2 V, beyond which it decomposes due to electrolysis of water at the counter electrode (cathode). The ITO electrode material is stable up to 2.4 V, above which it discolors due to partial reduction at the cathode. Oxidative polymerization of the EDOT monomer initiates anodically at the working electrode when the potential exceeded 1.9 V. It was not possible to incorporate a reference electrode directly into the gel sample. Instead, an $(EO)_{10}$-oleyl gel containing 0.01 M ferrocene was used to standardize the potential vs. Ag/AgCl (0.1 M in $CH_3CH$) reference. Prior to polymerization, samples were heated to 60° C. and cooled at 1° C./min. to improve LC order. The EDOT polymerization potential is substantially higher in $(EO)_{10}$-oleyl gel than in solution.

Example 8

Figure 8:
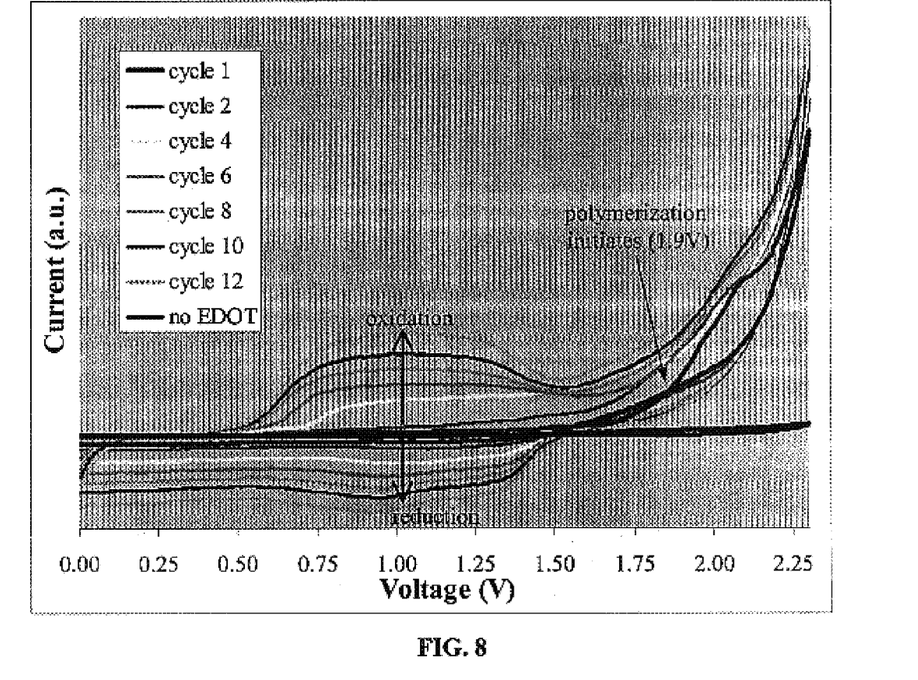
FIG. 8. Cyclic voltammetry of $(EO)_{10}$-oleyl gel doped with EDOT and TEAP. (Cycling at 50 mV/sec.) Increase of area within the curve indicates PEDOT polymerization. The black line shows CV for $(EO)_{10}$-oleyl gel containing TEAP only (no EDOT).
Figure 9:
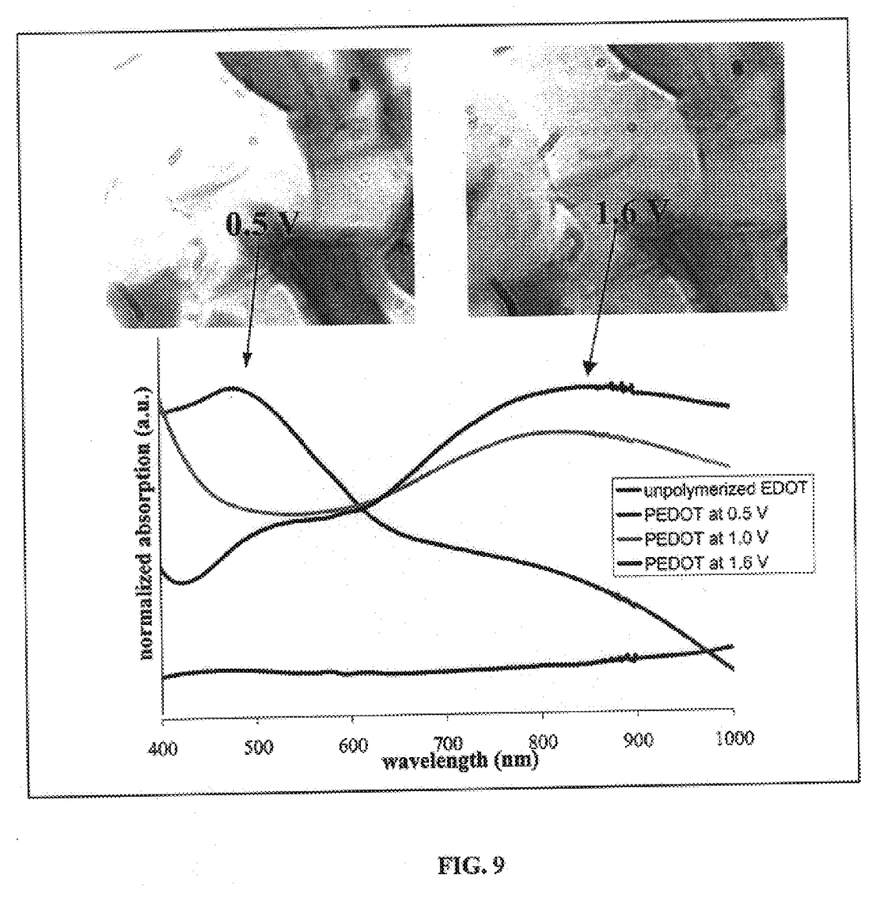
FIG. 9. Electrochromic behavior of PEDOT film within the $(EO)_{10}$-oleyl gel, switching from transparent (0.5V, reduced) to blue (1.6V, oxidized). The corresponding UV-vis spectra shows a shift in absorption maximum. Gels containing unpolymerized EDOT and TEAP are transparent across the visible range.
Figure 10:
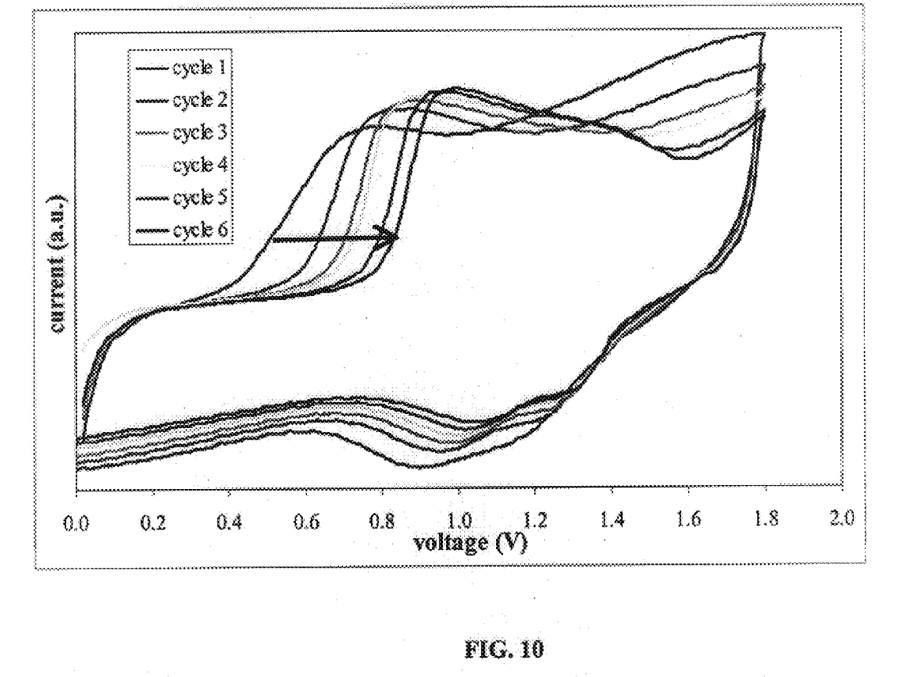
FIG. 10. Cyclic voltammetry of PEDOT film within the $(EO)_{10}$-oleyl gel. Cycling below the polymerization potential (1.9V) shows reversable oxidation and reduction. Shift in curves on successive cycles indicates conformational rearrangement of polymer within gel.

UV-vis spectroscopy has been performed in situ on the device shown in FIG. 7 both before and after polymerization (example 7), over wavelengths of 300 to 1000 nm. ITO coated glass absorbs strongly below 300 nm and the aqueous $(EO)_{10}$-oleyl gel absorbs above about 1000 nm. Thiophene-based polymers typically absorb in the range of 300–500 nm. PEDOT polymerization in the $(EO)_{10}$-oleyl template (examples 6 and 7) was performed by cycling the potential repeatedly from 0–2.2 V at rates from 3 to 150 mV/s, as well as using a constant potential >1.9 V. FIG. 8 shows an example of the cyclic voltammetry (CV) observed during electropolymerization (cathodic current is negative). Increasing area within the CV curve on successive cycle indicates growth of the polymer. Broad oxidation and reduction peaks, centered at 1.0 V, indicate the PEDOT formed is reversibly doped electrochemically. The films formed are electrochromic, switching from nearly transparent (reduced) to blue (oxidized). FIG. 9 includes optical micrographs showing this color change, as well as UV-vis spectra indicating the shift in absorption maximum corresponding to PEDOT oxidation. UV-vis of EDOT monomer in $(EO)_{10}$-oleyl gel, included as a control, shows complete transparency across the visible spectrum. FIG. 10 shows CV of the PEDOT film grown at 2.2 V for 30 sec. followed by cycling below the polymerization potential at 50 mV/s. While no additional polymer grows below 1.8 V, some rearrangement of the polymers within the gel occurs, as indicated by the shift in the oxidation peak. Polymerization results in two orders of magnitude increase in the conductivity of the gel and formation of an adherent blue film on the working electrode.

Example 9

Figure 11:
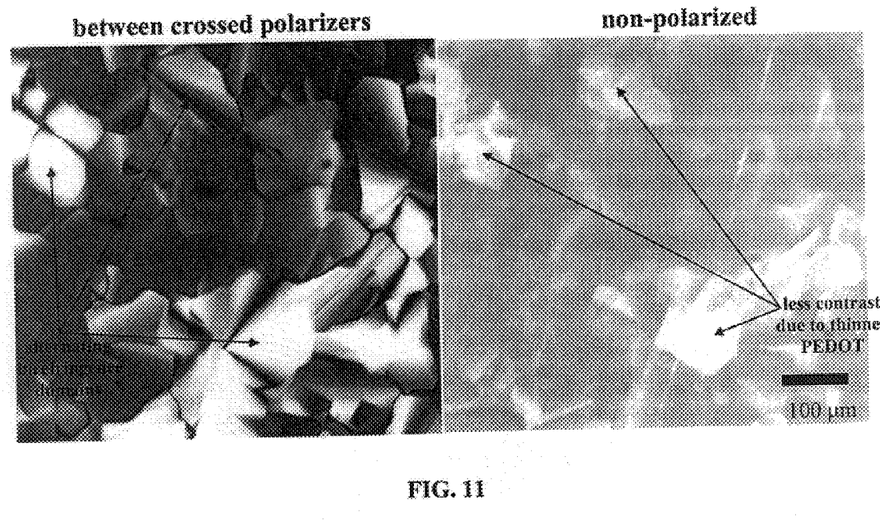
FIG. 11. Optical microscopy of PEDOT film within the $(EO)_{10}$-oleyl gel. Arrows indicate LC domains that switch from bright to dark under 45° rotation of crossed polarizers (aligned non-perpendicular to substrate). Corresponding areas in non-polarized image show less blue PEDOT film.

The observed microstructure of the PEDOT film (example 8) confirms a templating effect by the LC gel. Electropolymerization of PEDOT from organic solution results in a uniform, featureless film. However, PEDOT from a gel template of this invention has a morphology, when observed under non-polarized light, that matches the birefringence texture of the LC observed under polarized light, as shown in FIG. 11. The orientation of the LC domains affects the growth rate of the PEDOT film. Liquid crystal domains oriented normal with respect to the substrate (hydrophobic cores perpendicular with respect to the substrate) correspond to regions of thick, dark blue PEDOT film. In contrast, LC domains oriented perpendicular (hydrophobic cores, normal or non-perpendicular) to the substrate correspond to regions of little or no PEDOT growth. This makes sense if polymerization requires EDOT monomer to diffuse to the electrode surface by moving within the hydrophobic cores, as a non-perpendicular alignment of cylindrical cores with a substrate requires monomer to either cross through hydrophilic space or diffuse at an angle to the applied field in order to reach the electrode. Perpendicular alignment of hydrophobic cores provides a direct path for diffusion to the electrode surface. Even so, non-perpendicular or normal core alignment can be utilized to provide various film structures, orientations and corresponding physical, conductive and/or optical properties.

Example 10

Figure 12:
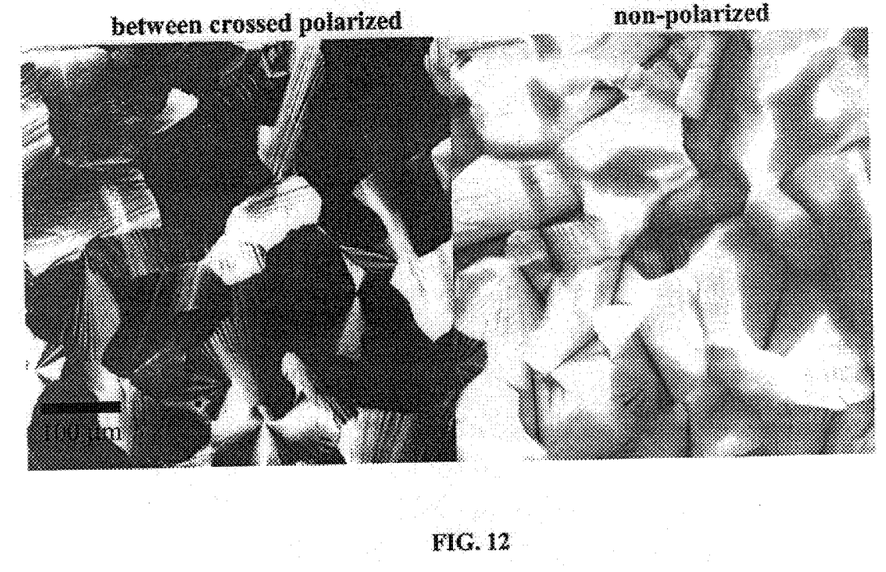
FIG. 12. Optical microscopy of PEDOT film after removal of the $(EO)_{10}$-oleyl gel. Templated PEDOT film mimics birefringence texture of LC under non-polarized light, as well as retaining faint birefringence between crossed polarizers.

With reference to example 9, when the electrodes are separated and the $(EO)_{10}$-oleyl gel is washed away, an adherent blue PEDOT film remains. As measured by profilometry, these films range from 100 nm–400 nm thick, depending on concentration and polymerization conditions. The domain texture described above persists after removal of the gel. Surprisingly, the PEDOT films themselves are birefringent, exhibiting a faint birefringence pattern identical to the LC from which it was polymerized. To ensure no $(EO)_{10}$-oleyl film remained on the surface, samples were soaked in $CH_2Cl_2$ for 4 hours and heated to 100° C. under vacuum for 12 hours. The birefringence pattern remained unchanged. FIG. 12 shows a birefringent PEDOT film. This is a novel result, as electropolymerization described in the literature result in amorphous films having no birefringence. As a control, PEDOT was electropolymerized from $(EO)_{10}$-oleyl gel at 70° C., above $T_i$. This film, as expected, was uniform and amorphous, with no domain texture or birefringence. The optical anisotropy of the liquid crystal is templated on the growing PEDOT polymer chains, providing good evidence of nanoscale ordering of the polymer.

Example 11

Figure 13:
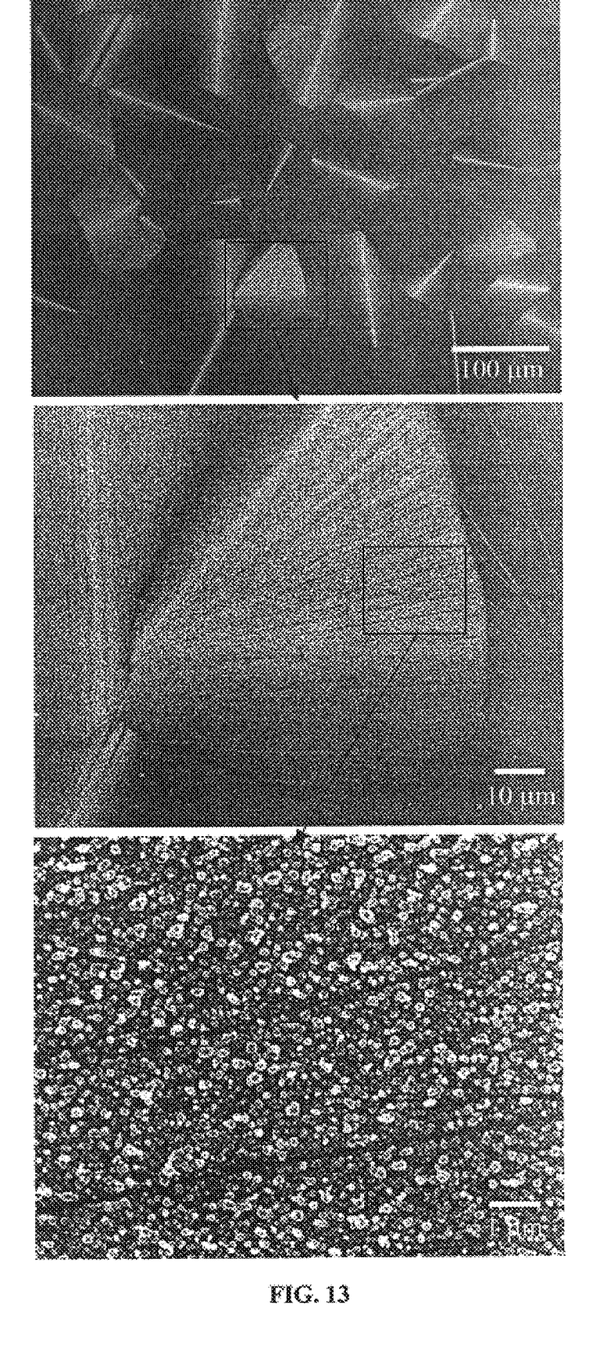
FIG. 13. SEM micrographs (2 kV) of PEDOT film at successively larger magnifications. Variations in morphology mimic LC birefringence texture. Boxes indicates magnified regions.
Figure 14:
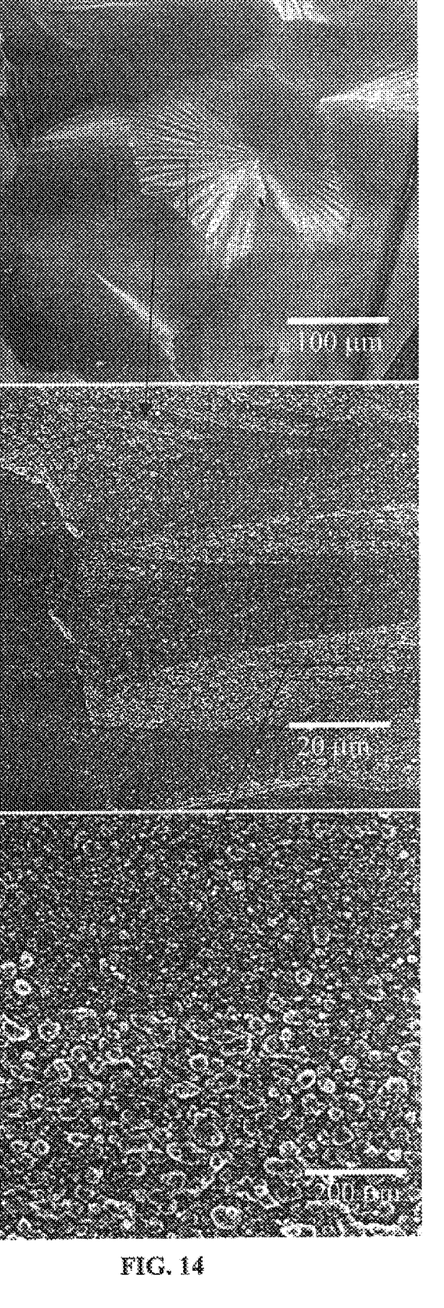
FIG. 14. SEM micrographs (2 kV) of PEDOT film at successively larger magnifications. LC orientation influences size and density of round surface features. Boxes indicates magnified regions.

Scanning electron microscopy (SEM) can be done directly on films electropolymerized on gold or ITO substrates, revealing features as small as 50 nm. SEM was used to study how the physical structure of PEDOT films mimics the birefringence texture of the LC gel. SEM micrographs at several magnifications are shown for one specimen in FIG. 13. The sample was prepared from an $(EO)_{10}$-oleyl gel doped with 0.1 M EDOT and 0.05 M TEAP. The specimen was electropolymerized by cycling from 0–2.2 V forty times at 100 mV/s. Areas appearing dark in the image were ~200 nm thick, while the bright regions consisted of PEDOT ~400 nm thick, measured by profilometry. The RMS roughness within a particular domain was ±15 nm (the substrate roughness was <2 nm). The series of images in FIG. 13 zooms in on a domain in the PEDOT film resembling the focal conic texture, sometimes observed in birefringence of the LC gel. Since this is an SEM image, the texture is due to variations in topography and electron density of the film, rather than optical anisotropy. In LCs the focal conic texture occurs because the LC director rotates around a defect. Striations appear at abrupt change in LC orientation where the director rotates through the polarization axis. The highest magnification image shows the PEDOT film has gaps where these striations existed in the LC, causing the film to mimic the appearance of the birefringence pattern. FIG. 14 shows another series of SEM micrographs, from a sample polymerized from 0.1 M EDOT, 0.1 M TEAP gel at a constant potential of 2.0 V followed by cycling forty times from 0–2.0 V at 50 mV/s. The morphology is similar, though somewhat thicker, than the previous film. By zooming in on the fan-like feature in the center of the image, one sees that the contrast difference between regions is related to changes in the size and density of round surface features ~50–100 nm in size. The orientation of LC domains seems to alter growth of the polymer, changing the morphology of these features.

As provided in the foregoing summary, description and examples, an aqueous, solution-based technique enabling alignment and patterning of conducting polymers directly during polymerization is distinctly advantageous for fabricating organic and/or integrated electronics. A range of applications would benefit from nanoscale control of the alignment of organic semiconductors. These include devices such as light emitting diodes and field effect transistors. Templating nanoscale structure within an electropolymerized conducting polymer film also significantly increases electrode surface area. The resulting enhanced electrode activity could find use in applications ranging from batteries to solar cells. Another potential application is in molecular sensing: A conducting polymer within a LC template might be used to detect changes within the liquid crystal due to molecules diffusing through the gel, by measuring optical quenching or changes in the conducting polymer's oxidation state. Isolated, individual polymers within the LC structure can interact more efficiently with the target molecule thus improving sensing.

While the principles of this invention have been described in connection with the specific embodiments, it should be understood clearly that the descriptions are provided only by way of example and are not intended to limit, in any way, the scope of this invention. For instance, in its broader aspects, this invention contemplates the use of various other liquid crystal systems, domains and/or components thereof, consistent with the foregoing, as a template for the orientation and growth of an organic semiconductor film. The identity of such polymeric films is limited only by the foregoing considerations, with the corresponding monomeric precursors used in conjunction with a particular, predetermined liquid crystal system. Other advantages and features will become apparent from the claims hereinafter, with the scope thereof determined by their reasonable equivalents, as would be understood by those skilled in the art.

What is claimed is:

1. A method of preparing a conductive polymeric film, said method comprising:

providing a liquid crystal phase comprising a plurality of hydrophobic cores, said phase on a substrate;

introducing a hydrophobic component to said phase, said component a conductive polymer precursor; and applying an electric potential across said liquid crystal phase, said potential sufficient to polymerize the said precursor.

2. The method of claim 1 wherein said liquid crystal phase comprises an amphiphilic component.

3. The method of claim 2 wherein said amphiphilic component is a polyalkylene oxide.

4. The method of claim 3 wherein said amphiphilic component is a polyalkylene oxide ether.

5. The method of claim 1 wherein said precursor is a monomer of a polymeric organic semiconductor.

6. The method of claim 5 wherein said hydrophobic cores are dimensioned sufficient for incorporation of said monomer therein.

7. The method of claim 6 wherein said monomer is selected from the group consisting of thiophene and substituted thiophenes.

8. The method of claim 7 wherein said monomer is EDOT and said liquid crystal phase comprises amphiphilic poly(ethylene oxide)oleyl ether.

9. The method of claim 1 wherein said precursor is soluble in said liquid crystal phase.

10. The method of claim 9 wherein said liquid crystal phase comprises an aqueous gel of amphiphilic components.

11. The method of claim 10 wherein said gel includes an electrolyte.

12. The method of claim 10 wherein said gel includes an additive to affect phase structure.

13. A method of using liquid crystal domains to align an organic polymeric film, said method comprising:

providing on a substrate a phase of ordered liquid crystal domains, each said domain having a hydrophobic core aligned with said substrate;

introducing a hydrophobic monomer to said phase; and applying a potential across said phase substantially parallel to said liquid crystal domains to provide a polymer aligned therewith.

14. The method of claim 13 wherein said phase in a solvent selected from the group consisting of water, polar organic solvents and combinations thereof.

15. The method of claim 14 wherein said phase comprises an aqueous gel of amphiphilic components.

16. The method of claim 13 wherein said hydrophobic cores are dimensioned for monomer alignment therein.

17. The method of claim 16 wherein said phase includes 1-decene, whereby said core dimension is modified.

18. The method of claim 13 wherein said liquid crystal domains comprise an amphiphilic component.

19. The method of claim 18 wherein said amphiphilic component is a polyalkylene oxide.

20. The method of claim 19 wherein said amphiphilic component is a polyalkylene oxide ether.

21. The method of claim 18 wherein said phase includes a glycol, whereby said liquid crystal domains are stabilized.

22. An organic semiconductor polythiophene film having a morphology exhibiting a birefringent texture under polarized light, said film obtained by providing a gel phase of a cylindrical amphiphilic liquid crystals, said phase including thiophene monomers; and applying a potential across said phase substantially parallel to said cylindrical liquid crystals, said film texture obtained from said liquid crystals.

23. The film of claim 22 wherein said polythiophene comprises bithiophene monomers.

24. The film of claim 22 wherein said polythiophene comprises EDOT monomers.

* * * * *

UNITED STATES PATENT AND TRADEMARK OFFICE
CERTIFICATE OF CORRECTION

PATENT NO.       : 6,680,215 B1
APPLICATION NO.  : 10/272707
DATED            : January 20, 2004
INVENTOR(S)      : Samuel I. Stupp and James F. Hulvat It is certified that error appears in the above-identified patent and that said Letters Patent is hereby corrected as shown below:

Col. 1, Line 10: "University." should read
--University and also pursuant to Grant No. N00014-99-1-0239 from the Office of Naval Research to Northwestern University.--

Signed and Sealed this

Twenty-eighth Day of August, 2007

JON W. DUDAS
*Director of the United States Patent and Trademark Office*